United States Patent
Dearnaley

(10) Patent No.: US 6,200,649 B1
(45) Date of Patent: Mar. 13, 2001

(54) METHOD OF MAKING TITANIUM BORONITRIDE COATINGS USING ION BEAM ASSISTED DEPOSITION

(75) Inventor: Geoffrey Dearnaley, San Antonio, TX (US)

(73) Assignee: Southwest Research Institute, San Antonio, TX (US)

( * ) Notice: Subject to any disclaimer, the term of this patent is extended or adjusted under 35 U.S.C. 154(b) by 0 days.

(21) Appl. No.: 09/359,062

(22) Filed: Jul. 21, 1999

(51) Int. Cl.[7] .......................... C23C 14/14; C23C 14/24; C23C 14/48; C23C 16/38; C23C 16/34
(52) U.S. Cl. .................... 427/530; 427/531; 427/528; 427/566; 427/255.38; 427/255.394
(58) Field of Search .................................. 427/528, 530, 427/531, 566, 255.394, 255.38

(56) References Cited

U.S. PATENT DOCUMENTS

| | | | |
|---|---|---|---|
| 3,915,757 | * 10/1975 | Engel | 427/528 |
| 4,237,184 | * 12/1980 | Gonseth et al. | 427/249.15 |
| 4,364,969 | * 12/1982 | Dearnaley et al. | 427/531 |
| 4,415,420 | * 11/1983 | Beale | 427/530 |
| 4,622,236 | 11/1986 | Morimoto et al. . | |
| 4,629,631 | * 12/1986 | Dearnaley | 427/528 |
| 4,656,052 | * 4/1987 | Satou et al. | 427/530 |
| 4,657,774 | * 4/1987 | Satou et al. | 427/530 |
| 4,746,563 | * 5/1988 | Nakano et al. | 427/255.34 |
| 4,842,710 | * 6/1989 | Freller et al. | 427/576 |
| 4,895,770 | * 1/1990 | Schintlmeister et al. | 427/250 |
| 5,680,292 | * 10/1997 | Thompson, Jr. et al. | 427/530 |

* cited by examiner

*Primary Examiner*—Marianne Padgett
(74) *Attorney, Agent, or Firm*—Paula D. Morris & Associates, P.C.

(57) ABSTRACT

A method of forming titanium boronitride coatings using ion beam assisted deposition. The method involves exposing the substrate to a vacuum, depositing titanium onto the substrate, substantially simultaneously exposing the substrate to a source comprising boron and nitrogen, and substantially simultaneously bombarding the substrate with an energetic beam of ions under conditions effective to form a quantity of titanium-boron bonds and a quantity of titanium-nitrogen bonds effective to produce a titanium boronitride coating having a hardness of at least about 5000 $kg/mm^2$.

40 Claims, No Drawings

METHOD OF MAKING TITANIUM BORONITRIDE COATINGS USING ION BEAM ASSISTED DEPOSITION

FIELD OF THE INVENTION

The present invention provides a controllable process for forming titanium boronitride coatings on large or small workpieces using ion beam assisted deposition. The process may be relatively easily scaled up for commercial use.

BACKGROUND OF THE INVENTION

Titanium nitride (TiN) has been widely used for wear-resistant coatings, e.g. on cutting tools, for many years. More recently, a mixed titanium aluminum nitride has provided improved performance on drills, and at least one group has reported superior hardnesses and wear life using deposited coatings of titanium boronitride (Ti—B—N).

The methods described to date for depositing titanium boronitride coatings are dual target magnetron sputtering processes, in which two targets are sputtered with an argon-nitrogen plasma. The two sputter targets are (1) titanium, and (2) titanium diboride. The properties of the resulting titanium boronitride coatings depend strongly upon the chemical composition of the coating formed. The best coating properties are obtained when the coating comprises particles having a small grain size, because this imparts hardness, and when the coating has a boron content of about 20 atomic % or less in relation to the titanium content, and a nitrogen content of about 40 atomic % or less in relation to the titanium content. The Vickers hardness number reported for the titanium boronitride coatings formed using dual target magnetron sputtering was 6800 HVN. The abrasive wear resistance reported for the same coatings was nine times better than that of TiN.

Unfortunately, magnetron sputtering involves so many process variables that it is difficult to exercise a great degree of control over the chemical composition of the resulting titanium boronitride coating. The process variables which may affect the chemical composition of a coating produced by dual target magnetron sputtering include: (1) the position of the workpiece relative to the two sputter targets; (2) the argon flow rate; (3) the nitrogen flow rate; (4) the power deposited in the plasma discharge; and, (5) the bias voltage used. In addition to the large number of process variables that can affect the chemical composition of the resulting coating, dual target magnetron sputtering suffers from the disadvantage that it cannot readily be used to coat large components because the distance between the sputter targets and the workpiece cannot be greater than about twelve inches.

A process is needed which can be used to coat large scale components, and which provides more control over the chemical composition of the resulting titanium boronitride coating.

SUMMARY OF THE INVENTION

The present invention provides a method for producing a titanium boronitride coating comprising: exposing a substrate to a vacuum, depositing onto the substrate an amount of titanium; substantially simultaneously exposing the substrate to a source comprising boron and nitrogen; and, substantially simultaneously bombarding the substrate with an energetic beam of ions under conditions effective to form a first quantity of titanium-boron bonds and a second quantity of titanium-nitrogen bonds effective to produce a titanium boronitride coating on said substrate having a hardness of at least about 5000 kg/mm$^2$.

DETAILED DESCRIPTION OF THE INVENTION

The present invention uses a technique known as ion beam assisted deposition (IBAD) to coat a workpiece with a hard, wear-resistant titanium boronitride coating with a relatively small grain size. The use of IBAD to form the coating results in fewer result-effective process variables and ultimately in better control over the chemical composition of the coating.

Using IBAD techniques, it is not necessary to provide a bias voltage to the workpiece, as in magnetron sputtering. IBAD offers considerably more control over the chemical composition of the coating. IBAD also is more amenable to scale up for commercial applications than magnetron sputtering. Because the distance between the ion source, the titanium source, and the workpiece are not critical, IBAD techniques are easily adapted to coat large and even complex shaped objects.

As persons of skill in the art will understand, IBAD involves vaporizing and condensing at least one reactant onto a substrate to be coated. The film of condensed vapor on the substrate, which preferably is a continuous film, is bombarded with an energetic beam of ions to impart the energy required to convert and or react the condensate with the substrate material and/or the ions in the beam. Other reactants may be added as well, either via condensation, as a "plasma" gas in the bombardment chamber, or as a part of the ion beam, itself IBAD may be used to form a titanium boronitride coating on substantially any substrate. Suitable substrates include, but are not necessarily limited to steels, titanium alloys, cobalt-cemented tungsten carbide, alumina, titanium nitride and nickel-based alloys. Preferred substrates are hard materials such as cemented carbides and titanium nitride.

In order to form the coating using IBAD techniques, the workpiece is cleaned using standard methods to remove superficial contaminants, such as grease. The workpiece is placed in a vacuum chamber that has been evacuated to a base pressure of about $10^{-5}$ torr or less. In a preferred embodiment, a bond coat of titanium is formed on the workpiece. The bond coat may be formed using any suitable means, including but not necessarily limited to evaporation from a resistively heated source or an electron beam heated evaporator. A preferred means is by vaporization of a suitable titanium source and condensation of the vapor onto the substrate. A preferred titanium source is titanium metal.

In a preferred embodiment, the titanium source is placed in a thermally-heated crucible or evaporator, and the titanium source is heated to vaporization by electrical resistive heating of the crucible or by electron beam heating of the titanium source, itself Electron beam heating is preferred because the intensity of the electron beam can be used to control the rate of deposition of the titanium, and because the rate of deposition of titanium using electron beam heating does not depend upon the quantity of metal in the crucible. In a preferred embodiment, titanium metal is heated to vaporization (from about 2200° C. to about 2300° C.) by electron beam heating.

The vaporized titanium is directed onto the workpiece using any suitable means, such as a nozzle. In a preferred embodiment, a thin film (about 100 nm) of titanium is deposited to act as a bond coat. One function of this titanium film or bond coat is to combine chemically with residual oxygen and hydrocarbons on the surface of the substrate to strongly bond these materials—materials which previously were only loosely adsorbed on the workpiece surface. After this initial deposition of a titanium film or bond coat, titanium, boron, and nitrogen are supplied, by any suitable means, in order to form titaniuim boronitride. The thickness of the final titanium boronitride coating preferably is in the range of from about 1 to about 5 microns. Persons of skill in the art will be familiar with the use of a quartz crystal monitor or other suitable methods to determine the rate of deposition of titanium and/or the resulting film. The deposition of titanium, by evaporation, is continued during subsequent exposure to the source(s) of boron and nitrogen.

Boron and nitrogen are supplied via a "plasma" or vapor in the vacuum chamber, as components of the ion beam, or one or both components may be supplied from both sources. Substantially any material containing boron and nitrogen, individually, or boron and nitrogen in combination may be used as the boron and nitrogen source. Suitable sources include, but are not necessarily limited to pure boron, boron carbide, boron nitride, and borazine. A preferred boron/nitrogen source is borazine ($B_3N_3H_6$). At ambient conditions, borazine is a liquid with physical properties similar to those possessed by benzene: borazine is an analog of benzene.

In a first embodiment, the workpiece bearing the titanium film is bombarded or irradiated, either in a continuous or interrupted fashion, with an energetic beam of ions in the presence of the borazine vapor. In this embodiment, the boron and nitrogen are provided via a "back-fill" or a controlled low pressure of borazine vapor into the vacuum chamber. A suitable method for providing a "back-fill" is described in R. A. Kant, B. D. Sartwell, I. L. Singer and R. G. Vardiman, *Nuclear Instruments & Methods in Physics Research B* 7/8 (1985) 915–919, incorporated herein by reference. The normally liquid borazine is vaporized, preferably by electrical resistive heating of a vessel containing a few grams of the substance, and supplied to the vacuum chamber preferably via a heated nozzle maintained at a temperature at least 10° C. higher than that of the borazine-containing reservoir. This is to avoid condensation of vapor in the feed tube. The resulting "back-fill" pressure is in the range of from about $10^{-5}$ torr to about $10^{-4}$ torr, preferably about $10^{-4}$ torr. Borazine naturally is a relatively reactive gas, and it is not necessary or even desirable to "activate" the borazine molecules using means such as arc discharge.

The energetic beam of ions may be supplied using any suitable means, including but not limited to a cold cathode ion source in which the gas or vapor is ionized without the need for high temperatures. A preferred ion source is a radio frequency fed ion gun. Suitable ions include, but are not necessarily limited to argon, nitrogen, ammonia, methane, and combinations thereof Preferred ions are argon ions or nitrogen ions, each from the appropriate elemental gas feedstock (Ar or $N_2$). Nitrogen ions are preferred where it is desirable to increase the nitrogen content of the resulting coating.

Molecules of the relatively reactive borazine vapor will adsorb onto the surface of the titanium film on the workpiece. The energy of the ion beam is sufficient to excite the adsorbed borazine molecules to bring about the necessary quantity of chemical reaction between titanium and the boron and nitrogen in the adsorbed borazine molecules. Typically, the energy is in the range of from about 500 eV to about 30 keV. The rate of ion arrival is important to the resulting chemical composition in this embodiment. A suitable rate of ion arrival is in the range of from about 1 ions to about 5 ions for each titanium atom on the workpiece, preferably 3 ions for each titanium atom on the workpiece. The bombardment continues until a titanium boronitride coating having a desired thickness is formed. For a coating having a preferred thickness of from about 500 nm to about 1 micron, the duration of bombardment is about thirty minutes.

In order to be commercially acceptable, the final coating should have a hardness of at least about 5000 kg/mm$^2$ (which corresponds to about 5000 HVN), preferably at least about 7000 kg/mm$^2$. In order to achieve this level of hardness, the bonding between the titanium-boron-nitrogen should be primarily covalent, and the final coating content should be (a) preferably less than about 20 atomic % boron in relation to the titanium content, and (b) preferably less than about 60 atomic % nitrogen, most preferably less than about 40 atomic % nitrogen in relation to the titanium content. The hydrogen present in the borazine is mainly lost due to the formation of gaseous fragments, and by sputtering of molecules such as NH, $NH_2$, $NH_3$, BH, $BH_2$, $BH_3$, $H_2$, and H.

In this first embodiment, the chemical composition of the coating is controlled by (1) the rate of ion arrival, or the number of bombarding argon or nitrogen ions for each titanium atom present on the workpiece, and (2) the back-fill pressure of the borazine vapor. A small grain size is achieved because IBAD is carried out at a relatively low temperature, typically in the range of from about 100° C. to about 200° C. As a result, the amount of grain growth is small. The titanium boronitride coating should have an average grain size in the range of from about 1 nm to about 4 nm, preferably about 2 nm.

In a second embodiment of the invention, the boron and nitrogen are supplied via the ion beam. Additional nitrogen also may be provided via the titanium vapor and/or nitrogen derived from nitrogen gas used to form the ion beam. Substantially any ion beam feedstock containing boron and nitrogen may be used to form the ion beam. Suitable ion beam feedstocks include, but are not necessarily limited to nitrogen, borazine, diborane, and ammonia. A preferred ion beam feedstock is borazine, preferably as a mixture with nitrogen gas. In a preferred embodiment, the feedstock from about 70% to about 90% borazine and from about to about 10% to about 30% nitrogen gas. In this second embodiment, titanium may be vaporized as in the first embodiment. In a preferred embodiment, titanium metal is evaporated in the presence of the gaseous backfill.

In this second embodiment, the content of nitrogen and boron in the resulting coating is controlled by (1) the pressure in the work chamber, preferably $10^{-5}$ torr or less, and (2) the content of the titanium/nitrogen condensed onto the surface of the workpiece.

Persons of ordinary skill in the art will recognize that many modifications may be made to the present invention without departing from the spirit and scope of the present invention. The embodiments described herein are meant to be illustrative only and should not be taken as limiting the invention, which is defined in the following claims.

I claim:

1. A method for producing a titanium boronitride coating comprising:

forming a first vapor consisting essentially of titanium;

condensing said first vapor onto a substrate, producing an amount of condensed titanium on said substrate;

exposing said substrate and said condensed titanium to a source comprising boron and nitrogen; and, bombarding said substrate and said condensed vapor in the presence of said source with an ion beam under second conditions effective to form said titanium boronitride coating on said substrate having a hardness of 5000 kg/mm² or more.

2. The method of claim 1 wherein said ion beam comprises ions selected from the group consisting of argon ions, nitrogen ions, and a combination thereof.

3. The method of claim 1 wherein said ion beam comprises nitrogen ions.

4. The method of claim 1 wherein
said coating comprises about 20 atomic % or less boron in relation to said amount of titanium in said coating; and
said coating comprises about 40 atomic % or less nitrogen in relation to said amount of titanium in said coating.

5. The method of claim 3 wherein
said coating comprises about 20 atomic % or less boron in relation to said amount of titanium in said coating; and
said coating comprises about 40 atomic % or less nitrogen in relation to said amount of titanium in said coating.

6. The method of claim 2 wherein
said coating comprises about 20 atomic % or less boron in relation to said amount of titanium in said coating; and
said coating comprises about 40 atomic % or less nitrogen in relation to said amount of titanium in said coating.

7. The method of claim 1 wherein said second conditions comprise:
a temperature of about 200° C. or less; and,
an ion beam energy of from about 500 eV to about 30 keV; and
a rate of ion arrival of about 1 ion to about 5 ions for each titanium atom.

8. The method of claim 7 wherein said second conditions comprise:
a temperature of about 200° C. or less; and,
an ion beam energy of from about 500 eV to about 30 keV; and
a rate of ion arrival of about 1 ion to about 5 ions for each titanium atom.

9. The method of claim 1 wherein said titanium boronitride coating is formed even absent a bias voltage on said substrate.

10. A method for producing a titanium boronitride coating comprising:
forming a first vapor consisting essentially of titanium;
condensing said first vapor onto a substrate, producing an amoumt of condensed titanium on said substrate;
exposing said substrate to a second vapor comprising borazine; and,
bombarding said substrate and said condensed vapor in the presence of said second vapor with an ion beam under second conditions effective to form said titanium boronitride coating on said substrate having a hardness of 5000 kg/mm² or more.

11. The method of claim 10 wherein said ion beam comprises ions selected from the group consisting of argon ions, nitrogen ions, and a combination thereof.

12. The method of claim 10 wherein said ion beam comprises nitrogen ions.

13. The method of claim 10 wherein
said coating comprises about 20 atomic % or less boron in relation to said amount of titanium in said coating; and
said coating comprises about 40 atomic % or less nitrogen in relation to said amount of titanium in said coating.

14. The method of claim 11 wherein
said coating comprises about 20 atomic % or less boron in relation to said amount of titanium in said coating; and
said coating comprises about 40 atomic % or less nitrogen in relation to said amount of titanium in said coating.

15. The method of claim 12 wherein
said coating comprises about 20 atomic % or less boron in relation to said amount of titanium in said coating; and
said coating comprises about 40 atomic % or less nitrogen in relation to said amount of titanium in said coating.

16. The method of claim 10 wherein said second conditions comprise:
a temperature of about 200° C. or less; and,
an ion beam energy of from about 500 eV to about 30 keV; and
a rate of ion arrival of about 1 ion to about 5 ions for each titanium atom.

17. The method of claim 10 wherein said titanium boronitride coating is formed even absent a bias voltage on said substrate.

18. A method for producing a titanium boronitride coating comprising:
forming a first vapor comprising titanium;
condensing said first vapor onto a substrate, producing an amount of condensed titanium on said substrate;
bombarding said substrate and said condensed titanium with an ion beam derived from a feedstock comprising borazine under second conditions effective to form said titanium boronitride coating on said substrate having a hardness of about 5000 kg/mm² or more even absent a bias voltage on said substrate.

19. The method of claim 18 further comprising exposing said substrate and said condensed vapor to a second vapor comprising borazine, wherein said bombarding occurs in the presence of said second vapor.

20. The method of claim 18 wherein
said coating comprises about 20 atomic % or less boron in relation to said amount of titanium in said coating; and
said coating comprises about 40 atomic % or less nitrogen in relation to said amount of titanium in said coating.

21. The method of claim 19 wherein
said coating comprises about 20 atomic % or less boron in relation to said amount of titanium in said coating; and
said coating comprises about 40 atomic % or less nitrogen in relation to said amount of titanium in said coating.

22. The method of claim 18 wherein said second conditions comprise:
a temperature of about 200° C. or less; and,
an ion beam energy of from about 500 eV to about 30 keV; and
a rate of ion arrival of about 1 ion to about 5 ions for each titanium atom.

23. The method of claim 19 wherein said second conditions comprise:
a temperature of about 200° C. or less; and,
an ion beam energy of from about 500 eV to about 30 keV; and
a rate of ion arrival of about 1 ion to about 5 ions for each titanium atom.

24. The method of claim 18 wherein said titanium boronitride coating is formed even absent a bias voltage on said substrate.

25. The method of claim 19 wherein said titanium boronitride coating is formed even absent a bias voltage on said substrate.

26. A method for producing a titanium boronitride coating comprising:

forming a first vapor consisting essentially of titanium;

condensing said first vapor onto a substrate, producing condensed titanium on said substrate; exposing said substrate and said condensed titanium to a source comprising boron and nitrogen; and, bombarding said substrate and said condensed titanium in the presence of said source with an ion beam under conditions effective to form said titanium boronitride coating having an average grain size of from about 1 nm to about 4 nm.

27. The method of claim 26 wherein said average grain size is about 2 nm.

28. The method of claim 26 wherein said titanium boronitride coating has a hardness of about 5000 kg/mm$^2$ or more.

29. The method of claim 26 wherein said titanium boronitride coating is produced even absent a bias voltage on said substrate.

30. The method of claim 27 wherein said titanium boronitride coating is produced even absent a bias voltage on said substrate.

31. The method of claim 28 wherein said titanium boronitride coating is produced even absent a bias voltage on said substrate.

32. A method for producing a titanium boronitride coating comprising:

forming a first vapor consisting essentially of titanium;

condensing said first vapor onto a substrate, producing condensed titanium on said substrate;

exposing said substrate to a second vapor comprising borazine; and, bombarding said substrate and said condensed titanium in the presence of said second vapor with an ion beam under conditions effective to form said titanium boronitride coating having an average grain size of from about 1 nm to about 4 nm.

33. The method of claim 32 wherein said average grain size is about 2 nm.

34. The method of claim 32 wherein said ionbeam is derived from said borazine.

35. The method of claim 33 wherein said ion beam is derived from said borazine.

36. The method of claim 32 wherein said titanium boronitride coating has a hardness of about 5000 kg/mm$^2$ or more.

37. The method of claim 34 wherein said titanium boronitride coating has a hardness of about 5000 kg/mm$^2$ or more.

38. The method of claim 32 wherein said titanium boronitride coating is formed even absent a bias voltage on said substrate.

39. The method of claim 34 wherein said titanium boronitride coating is formed even absent a bias voltage on said substrate.

40. The method of claim 39 wherein said titanium boronitride coating is formed even absent a bias voltage on said substrate.

\* \* \* \* \*